United States Patent [19]
Tanimoto et al.

[11] Patent Number: 5,151,749
[45] Date of Patent: Sep. 29, 1992

[54] METHOD OF AND APPARATUS FOR MEASURING COORDINATE POSITION AND POSITIONING AN OBJECT

[75] Inventors: Akikazu Tanimoto; Saburo Kamiya, both of Yokohama, Japan

[73] Assignee: Nikon Corporation, Tokyo, Japan

[21] Appl. No.: 707,925

[22] Filed: May 28, 1991

Related U.S. Application Data

[63] Continuation of Ser. No. 529,662, May 29, 1990, abandoned.

[30] Foreign Application Priority Data

Jun. 8, 1989 [JP] Japan .................. 1-145733

[51] Int. Cl.[5] .......................................... G01B 11/00
[52] U.S. Cl. .................. 356/375; 250/548; 356/400; 356/401; 356/358; 356/363
[58] Field of Search ............... 356/373, 375, 399, 400, 356/401, 358, 363; 33/1 M; 250/548; 355/53

[56] References Cited

U.S. PATENT DOCUMENTS

| | | | |
|---|---|---|---|
| 3,692,413 | 9/1972 | Marcy et al. | 356/363 |
| 3,791,739 | 2/1974 | Kawasaki | 356/363 |
| 4,385,838 | 5/1983 | Nakazawa et al. | 356/399 |
| 4,676,649 | 6/1987 | Phillips | 356/363 |
| 4,958,082 | 9/1990 | Makinouchi et al. | 250/548 |

*Primary Examiner*—F. L. Evans
*Attorney, Agent, or Firm*—Shapiro and Shapiro

[57] ABSTRACT

A method and apparatus for measuring the coordinate position of a stage on which a semiconductor wafer or the like is placed. Two $\theta$ interferometers are provided as measuring means for detecting local curving deviations of reflecting surfaces of two plane mirrors perpendicular to each other which mirrors are provided on the stage for detection of the coordinate position of the stage based on the use of light wave interferometers. The curving deviations of the reflecting surfaces of the plane mirrors are measured with the $\theta$ interferometers to calculate the difference thereby measured and, hence, the true curving deviations of the reflecting surfaces while cancelling out errors in linear movement of the stage. The position of the stage measured with the coordinate position measuring light wave interferometers is corrected by values corresponding to the true curving deviations.

6 Claims, 5 Drawing Sheets

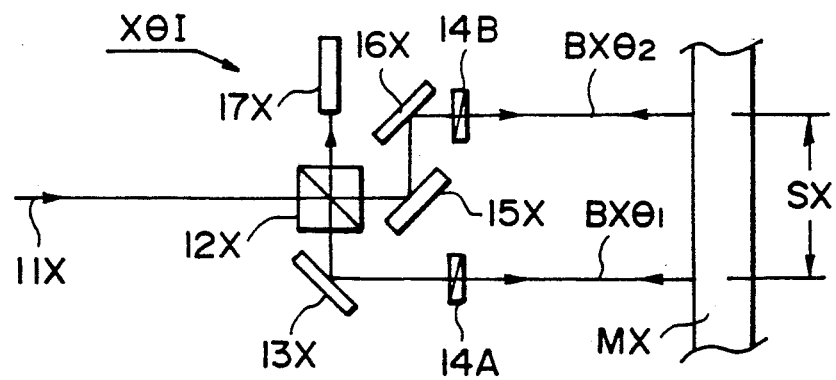
F I G. 4
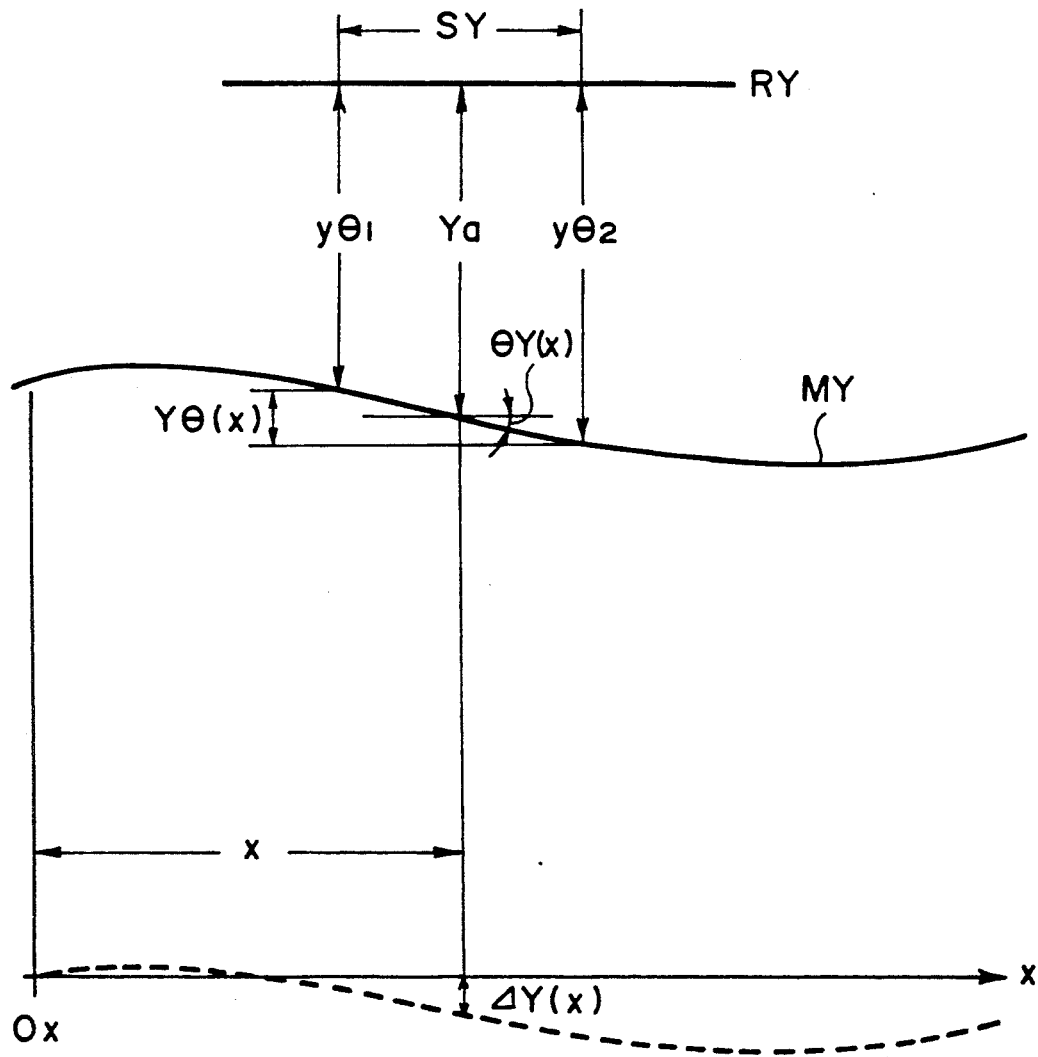
F I G. 5

METHOD OF AND APPARATUS FOR MEASURING COORDINATE POSITION AND POSITIONING AN OBJECT

This is a continuation of application Ser. No. 529,662 filed May 29, 1990, now abandoned.

BACKGROUND OF THE INVENTION

1. Field of the Invention

This invention relates to a method and apparatus for measuring the position of a stage which is moved two-dimensionally on a plane and for placing an object on the stage while two-dimensionally positioning the object and, more particularly, to a technique for measurement and positioning which need to be performed with high accuracy for particular operations such as working and inspection in semiconductor device manufacture.

2. Related Background Art

A kind of XY stage for retaining an object and precisely moving the same in each of the directions of two axes (X- and Y-axes) perpendicular to each other is used in various apparatus used for transfer of VLSI patterns, including exposure apparatus (steppers and the like), a apparatus for drawing transfer masks, apparatus for measuring coordinates of mask pattern positions and other apparatus for positioning. For measurement of coordinates of the XY stage, a light wave interferometer (laser interferometer) is employed whose light source is, for example, a He-Ne frequency-stabilized laser capable of continuously oscillating at a wavelength of 633 nm. Laser interferometers put on the market by Hewlett Packard Co., Excel Corp. and Zaigo Inc. are known. Essentially, one laser interferometer enables one-dimensional measurement alone, two identical laser interferometers are therefore prepared for two-dimensional measurement. Two plane mirrors having reflecting surfaces perpendicular to each other are fixed on the XY stage, two beams are respectively projected from the laser interferometers on the two plane mirrors, and the change in the stage position in the direction perpendicular to each reflecting mirror surface is measured to calculate the two-dimensional coordinate position of the stage. The reflecting surfaces of the two plane mirrors respectively extend in the directions x and y according to the stroke of the necessary movement of the stage. These plane mirrors are used as a basis for coordinate measurement, and the reflecting surfaces must have a very high degree of flatness. The measurement resolution of the laser interferometer is about 0.01 μm, and the necessary length of the reflecting surface of each plane mirror is about 250 mm in the case of a stage on which a 6 inch semiconductor wafer is placed. That is, if the whole reflecting surface having a length of 250 mm is inclined or locally curved or non-flat and if the deviation from the reference plane is larger than 0.01 μm, this deviation is taken in the value representing the result of measurement using the laser interferometer. Accordingly, if the curving deviation of the plane mirror is 0.05 μm, the measurement or positioning of the stage position is effected with a curvilinear (or oblique) coordinate system deviated from the ideal orthogonal coordinate system by 0.05 μm. Conventionally, for this reason, the plane mirror is manufactured so as to maximize the flatness, but a degree of unevenness of about 0.02 μm is left owing to manufacture errors. The accuracy enabling limitation of the degree of unevenness to 0.02 μm with respect to the whole of the 250 mm reflecting surface is such that a string stretched between two points spaced part from each other by 100 km sags by only 0.8 cm at the center.

It is of course possible to further improve the accuracy according to the method of working the plane mirror. However, for improvement in the flatness, the manufacture cost is considerably increased. In fact, it is impossible to maintain a flatness of 0.02 μm or less due to deformation of the mirror at the time of fixation on the two-dimensionally movable stage or due to secular changes.

To cope with problem, a curve (unevenness) of a plane mirror fixed on the movable stage may be measured by using a reference plane mirror as a standard. In this case, a reference plane mirror having a shape generally equal to that of the mirror to be measured is placed on the stage generally in parallel with the measured plane mirror, beams are projected from an interferometer on the measured plane mirror and the reference plane mirror perpendicularly to the same, and the curving deviation of the measured plane mirror relative to the reference plane mirror is obtained from the change in the distance therebetween determined by the interference between the reflection beams.

However, the method of using such a reference mirror entails drawbacks described below. The manufacture of the reference mirror requires certain labor and cost. Even if an accurate reference mirror can be manufactured, it is difficult to temporarily mount the reference mirror on the stage, and the mounting operation requires much time. In particular, when the reference plane mirror is attached to the stage, it is necessary to avoid application of excessive stresses to the optical block of the reference plane mirror, which stress may deform the block.

Even if such problems can be solved, complicated calculations are required for measurement of the curving deviations, which makes the measurement operation laborious.

Recently, the level of the positioning accuracy of exposure apparatus incorporating this kind of stage is being increased with the reduction in the resolution line width on submicron order (0.8 to 0.4 μm). Accordingly, the influence of curves of plane mirror therefore becomes considerable.

SUMMARY OF THE INVENTION

In view of the above-described problems of the prior art, it is an object of the present invention to make it possible to easily and precisely measure curves of the surfaces of plane mirrors mounted on a stage without using any reference plane mirror, and to thereby improve the accuracy with which the position of the stage is measured and, hence, the accuracy with which the stage is positioned.

According to the present invention, two θ interferometers are provided as measuring means for detecting local curving deviations of reflecting surfaces of two plane mirrors perpendicular to each other which mirrors are provided on the stage for detection of the coordinate position of the stage based on the use of light wave interferometers. The curving deviations of the reflecting surfaces of the two plane mirrors are measured with the two θ interferometers, and the difference between the values measured by these θ interferometers is calculated, thereby obtaining the true curving deviations of the reflecting surfaces by cancelling out errors in linear movement of the stage. The position measured with the coordinate position measuring light wave interferometers is corrected by values corresponding to the true curving deviations.

According to the present invention, two $\theta$ interferometers are provided to obtain inclinations of portions of the reflecting surfaces of the plane mirrors facing in the directions x and y. These $\theta$ interferometers are simultaneously used to measure yawing of each plate mirror (i.e., yawing of the stage). When the stage is moved one-dimensionally in the direction x or y, the sum of the curving deviation of one of the plane mirrors and the extent of yawing of the stage is measured with the corresponding one of the $\theta$ interferometers, while only the extent of yawing is measured with the other $\theta$ interferometer. Then, the difference between the values measured with the two $\theta$ interferometers is calculated, which difference corresponds to the curving deviation of the plane mirror. This curving deviation of the plane mirror is stored and is used for correction of the coordinate position of the stage at the time of position measurement or positioning, thereby achieving substantially the same measuring or positioning accuracy as an ideal apparatus having perfectly flat reflecting mirror surfaces.

These and other objects, features and advantages of the present invention will become sufficiently clear by the following detailed description taken in conjunction with the accompanying drawings.

BRIEF DESCRIPTION OF THE DRAWINGS

FIG. 4 is a diagram schematically showing a interferometer having a polarized light beam splitter;

FIG. 5 is a diagram showing a state of measurement of curves of a moving mirror fixed on the stage;

DESCRIPTION OF THE PREFERRED EMBODIMENTS

Embodiments of the present invention will be described below with reference to the accompanying drawings.

Figure 1:
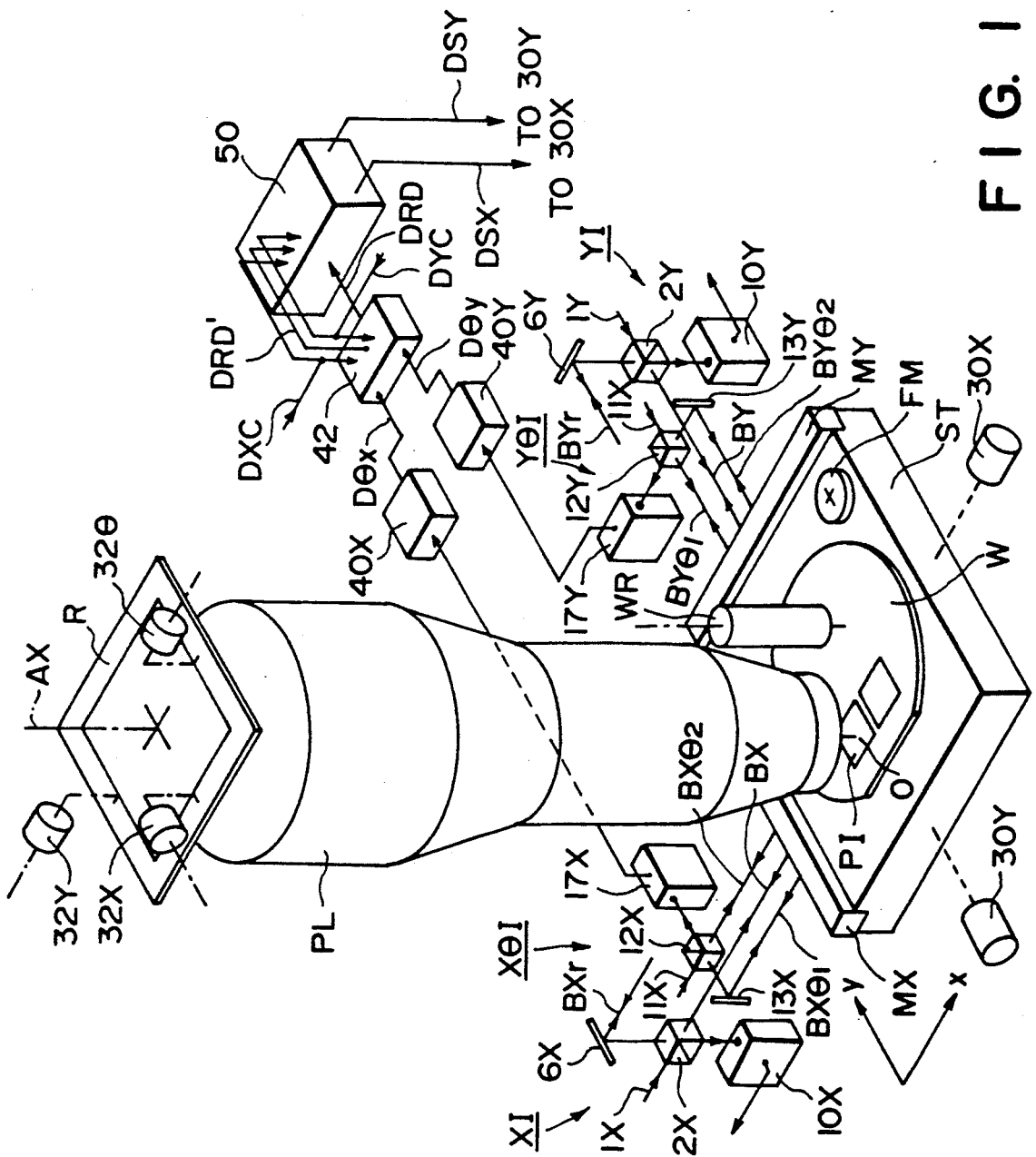
FIG. 1 is a schematic perspective view of the construction of a stepper to which a position measuring apparatus which represents a first embodiment of the present invention is applied.
Figure 2:
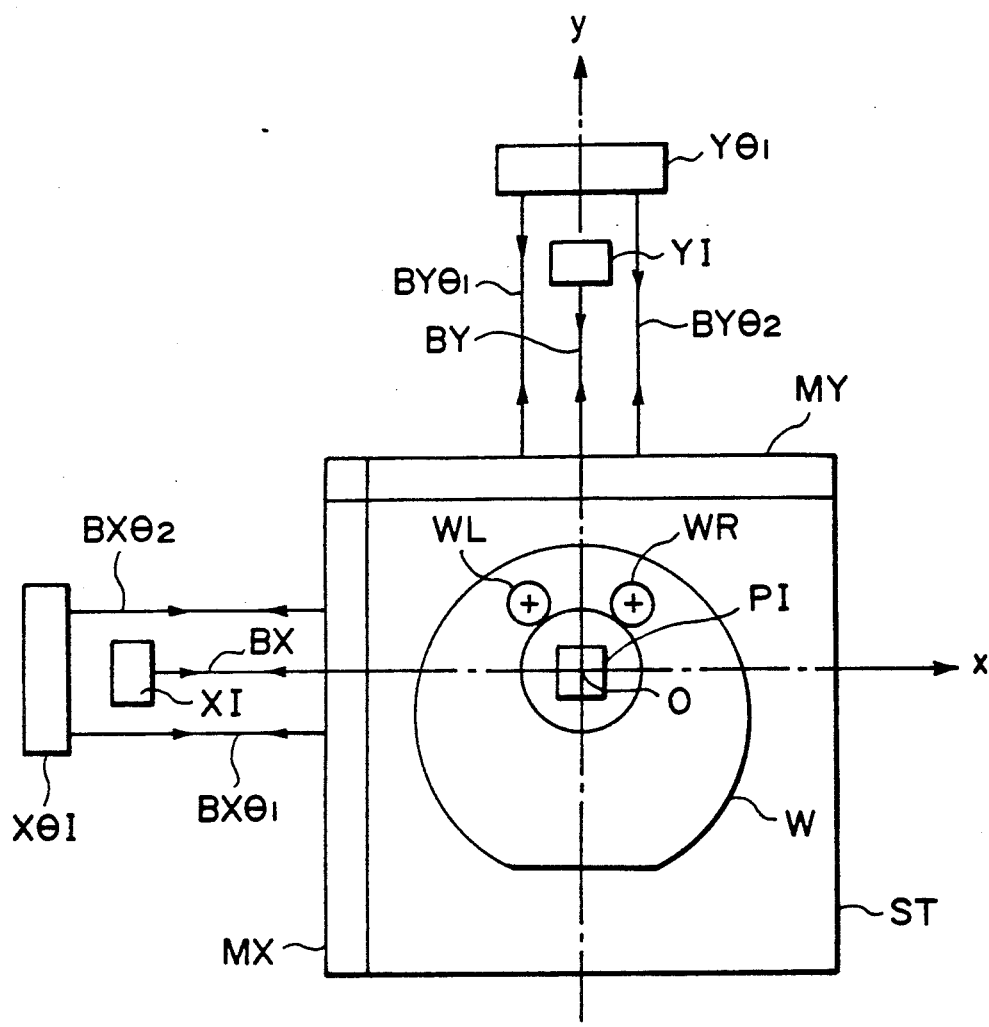
FIG. 2 is a plan view of stage components of the apparatus shown in FIG. 1, showing the placement of the stage components.

FIG. 1 schematically shows in perspective the construction of a stepper to which a position measuring apparatus which represents a first embodiment of the present invention is applied, and FIG. 2 shows in plan the placement of stage components of the apparatus shown in FIG. 1.

Referring to FIG. 1, a reticle R having a circuit pattern or the like is precisely positioned relative to an optical axis AX of a projecting lens PL by using reticle alignment optical systems 32X, 32Y, and 32$\theta$. The projecting lens PL projects a pattern image PI of the reticle R on a wafer W so that this image is superposed on one of a plurality of local regions (shot regions) of the wafer surface. The wafer W is fixed on a stage ST which can be driven by each of motors 30X and 30Y to be moved parallel in corresponding one of directions x and y. A reference mark plate FM for, e.g., calibration of the alignment systems is fixed on the stage ST so that its surface is flush with the surface of the wafer W. A moving mirror (plane mirror) MX having a reflecting surface extending in the direction y and another moving mirror (plane mirror) MY having a reflecting surface extending in the direction x are fixed on two side portions of the stage ST perpendicular to each other. As also shown in FIG. 2, a laser beam BX emerging from a light wave interferometer XI for detecting the position in the direction x (change in distance) is projected on the moving mirror MX perpendicularly to the mirror surface, and a laser beam BY emerging from a light wave interferometer YI for detecting the position in the direction y is projected on the moving mirror MY perpendicularly to the mirror surface. The center line of the beam BX is parallel to the x-axis, and has a production intersecting the optical axis AX of the projecting lens PL at the origin O. The center line of the beam BY is parallel to the y-axis and has a production intersecting with the optical axis AX at the origin O.

Two beams BX$\theta_1$ and BX$\theta_2$ produced by an X-axis $\theta$ interferometer X$\theta$I are projected on the moving mirror MX perpendicularly to the mirror surfaces, and the difference between the optical paths of the beams BX$\theta_1$ and BX$\theta_2$ is measured by the X-axis $\theta$ interferometer X$\theta$I. Two beams BY$\theta_1$ and BY$\theta_2$ produced by a Y-axis $\theta$ interferometer Y$\theta$I are projected on the moving mirror MY perpendicularly to the mirror surfaces, and the difference between the optical paths of the beams BY$\theta_1$ and BY$\theta_2$ is measured by the Y-axis $\theta$ interferometer Y$\theta$I. The two $\theta$ interferometers X$\theta$I and Y$\theta$I serve as a curving deviation measuring means in accordance with the present invention to respectively measure the rotational deviation of the moving mirror MX in a range determined by the distance between the two beams BX$\theta_1$ and BX$\theta_2$ in the direction y and the rotational deviation of the moving mirror MT in a range determined by the distance between the two beams BY$\theta_1$ and BY$\theta_2$ in the direction x.

The positions of alignment marks provided on the wafer W and the reference mark FM are detected by off-axis type wafer alignment systems WR and WL fixed outside the field of the projecting lens PL. The detection centers of the wafer alignment systems WR and WL are juxtaposed in the direction x so as to be symmetrical with respect to the y-axis passing through the origin O. The direction between the detection centers in the direction x is fixed at a certain predetermined value (smaller than the diameter of the wafer W). The wafer alignment systems WR and WL are constructed so as to capable of photoelectrically detecting a direction-x alignment mark and a direction-y alignment mark (not shown) on the wafer W through the same objective lens, that is, capable of detecting two-dimensional errors in positioning the marks.

The fundamental constructions of the position detecting light wave interferometers XI and YI and the interferometers X$\theta$I and Y$\theta$I will be briefly described below with reference to FIG. 1. The light wave interferometer XI for detecting the direction-x position is constituted by a beam splitter 2X such as an opaque prism for splitting a He-Ne laser beam 1X into the beam BX used for measurement and a reference beam $BX_r$, a mirror 6X, and a receiver 10X. The reference beam $BX_r$ is projected on a reference mirror (not shown) fixed to a lower end portion of the projecting lens PL. The reflection beam from the reference mirror and the reflection beam from the moving mirror MX are coaxially incident upon the receiver 10X, and changes in the fringes caused by the interference between these two reflection beams are photoelectrically detected by the receiver 10X. Similarly, the light wave interferometer YI for detecting the direction-y position is constituted by a beam splitter 2Y upon which a laser beam 1Y shown in FIG. 1 is incident, a mirror 6Y, and a receiver 10Y. A reference beam $BY_r$ is projected on a reference mirror (not shown) fixed to the projecting lens PL. The optical interferometers XI and YI may be of any type. However, the description for possible types and details of the functions of the interferometers XI and YI is not specifically necessary for the explanation of the present invention. A light wave interferometer having a polarized light beam splitter will be briefly described below as an example of the interferometers XI and YI with reference to FIG. 3.

Figure 3:
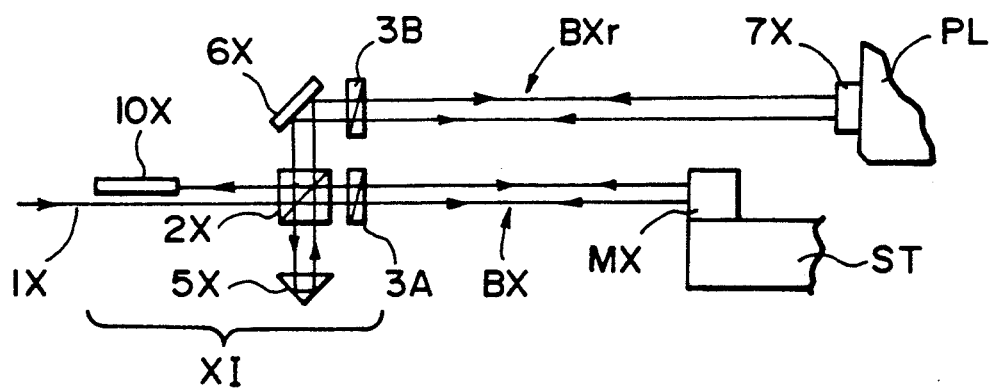
FIG. 3 is a diagram schematically showing the construction a coordinate position measurement interferometer having a polarized light beam splitter.

In FIG. 3, an example of the construction of the light wave interferometer XI, which forms a plane mirror interferometer, is viewed in an x-z plane perpendicular to an x-y plane. In this interferometer, a He-Ne laser beam 1X having polarized light components (p polarized light and s polarized light) having a frequency difference and orthogonal with each other is incident upon the polarized beam splitter 2X and is split according to the directions of polarization into a beam (BX) traveling to the moving mirror MX and another mean ($BX_r$) traveling via the mirror 6X to the reference mirror 7X fixed to a body tube member 8 of the projecting lens PL. $\frac{1}{4}$ wave plates (hereinafter referred to as "$\lambda/4$ plates") 3A and 3B are respectively disposed in the optical paths (BX, $BX_r$) between the polarized beam splitter 2X and the moving and reference mirrors MX and 7X, and a corner cube 5X is fixed below the polarized beam splitter 2X.

The beam separated from the beam 1X by being reflected by the beam splitter 2X is a polarized light. This beam of s polarized light is converted into a circularly polarized light by the $\lambda/4$ plate 3B and is projected on the lower half of the reference mirror 7X. The beam reflected by this mirror portion returns through the same optical path. The reflection beam is then converted into p polarized light having an oscillation plane perpendicular to that of the light traveling toward the reference mirror 7X, when it passes through the $\lambda/4$ plate 3B. This polarized beam passes through the polarized beam splitter 2X, is reflected by the corner cube 5X to travel in the opposite direction and is incident upon the beam splitter 2X again. Further, the p polarized light passes through the polarized beam splitter 2X, is reflected by the mirror 6X and is converted into circularly polarized light by the $\lambda/4$ plate 3B again to reach the upper half of the reference mirror 7X. The beam reflected by this mirror portion to travel in the opposite direction returns via the $\lambda/4$ plate 3B and the mirror 6 while being converted into s polarized light by the $\lambda/4$ plate 3B, and is reflected by the polarized beam splitter 2X to be incident upon the receiver 10X.

On the other hand, the part (p polarized light) of the beam 1X passing through the beam splitter 2X is converted into circularly polarized light by the $\lambda/4$ plate 3B and is reflected by the lower half of the moving mirror MX. The beam which is reflected by this mirror to travel in the opposite direction is converted into s polarized light by the $\lambda/4$ plate 3B, is reflected by the beam splitter 2X to travel downward, and is returned by the corner cube 5X in the opposite direction. The s polarized light from the corner cube 5 is reflected by the beam splitter 2X and is projected on the upper half of the moving mirror MX. The beam thereby reflected passes through the $\lambda/4$ plate 3B to be converted into p polarized light and passes through the beam splitter 2X to be incident upon the receiver 10X. The beams reflected by the moving mirror MX and the reference mirror 7X and received by the receiver 10X are made to interfere with each other by being equalized in polarized direction. The receiver 10X detects the changes in the difference between the two optical paths (BX and $BX_r$) by a heterodyne system utilizing the difference between the frequencies based on the difference between the direction of polarization of the beam 1X. The light wave interferometer on the Y-side will not be described because it has the same construction as the light wave interferometer on the X-side.

Next, the fundamental construction of the $\theta$ interferometers $X\theta I$ and $Y\theta I$ will be described below with reference to FIG. 1. The $\theta$ interferometer $X\theta I$ is constituted by a beam splitter 12X such as an opaque prism for splitting an incident laser beam 11X in two directions, a mirror 13X for reflecting part of the beam reflected by the beam splitter 12X in the direction of the moving mirror MX, and a receiver 17X. The two beams $BX\theta_1$ and $BX\theta_2$ of the $\theta$ interferometer $X\theta I$ are parallel to each other, and the distance between these beams is about 10 to several 10 mm. The beam BX from the laser interferometer XI is positioned generally at the center of spacing between the beams $BX\theta_1$ and $BX\theta_2$, as shown in FIG. 2. Similarly, the other $\theta$ interferometer $Y\theta I$ is constituted by a beam splitter 12Y, a mirror 13Y and a receiver 17Y to project two beams $BY\theta_1$ and $BY\theta_2$ perpendicularly to the reflecting surface of the mirror MY while spacing apart the same by a certain distance.

An example of the construction of the $\theta$ interferometer $X\theta I$ having a polarized light beam splitter will be described below in detail with reference to FIG. 4. The $\theta$ interferometer $X\theta I$ in accordance with the present invention is not limited to the example shown in FIG. 4; any construction may suffice so long as the change in the difference between the optical paths of the two beams $BX\theta_1$ and $BX\theta_2$ can be obtained.

Referring to FIG. 4, a laser beam 11X having polarized light components having a certain frequency difference and orthogonal with each other is split into two by the polarized beam splitter 12X, and a beam of s polarized light reflected by the polarized beam splitter 12X is projected as the beam $BX\theta_1$ on the moving mirror MX perpendicularly to the same at one point via the mirror 13X and a $\theta/4$ plate 14A. The beam thereby reflected is converted into p polarized light by the $\theta/4$ plate 14A and reaches the receiver 17X via the mirror 13A and the polarized light beam splitter 12X. Another beam of p polarized light separated from the laser beam 11X by passing through the polarized beam splitter 12X is projected as the beam $BX\theta_2$ on the moving mirror MX perpendicularly to the same at another point through mirrors 15X and 16X and a $\theta/4$ plate 14B. The beam thereby reflected is converted into s polarized light by the θ/4 plate 14B, is reflected by the mirrors 6X and 15X and the polarized light beam splitter 12X, and reaches the receiver 17X. The beams $BX\theta_1$ and $BX\theta_2$ are parallel to the X-axis, and the distance between these beams is SX (10 to several 10 mm) at the reflecting surface of the moving mirror MX. The returning reflection beam coaxial with the beam $BX\theta_1$ and the returning reflection beam coaxial with the beam $BX\theta_2$ are coaxially combined by the polarized beam splitter 2X to be incident upon the receiver 17X. The two reflection beams introduced into the receiver 17X are equalized in polarized direction by an analyzer (not shown). The other θ interferometer YθI has the same construction and will not be described particularly.

Actually, each of the θ interferometers XθI and YθI is arranged to measure, by using a fixed mirror (not shown) for reference, the difference between the optical paths at the two points at which these paths meet the surface of the moving mirror MX or MY, although the reference means including the fixed mirror is omitted in FIG. 4.

In the arrangement shown in FIG. 1, measurement signals respectively output from the receivers 17X and 17Y of the θ interferometers are supplied to digital counters 40X and 40Y for measuring the rotational deviation (yawing, curving deviation and so on) and these counters supplies data $D\theta_x$ and data $D\theta_y$ in accordance with the rotational deviation (yawing, curving deviation and so on) to a coordinate correction circuit 42. The coordinate correction circuit 42 has an arithmetic section for calculating differences between values of data $D\theta_x$ and data $D\theta_y$, and a memory section for storing the differences in correspondence with the moving positions of the stage ST in the directions x and y.

A signal output from the receiver 10X of the light wave interferometer XI for measuring the coordinate position is converted into a digital coordinate value DXC by a counter circuit (not shown), while a signal output from the receiver 10Y of the light wave interferometer YI is converted into a digital coordinate value DYC by a counter circuit (not shown). A main control system 50 to which these coordinate values DXC and DYC are supplied has a function of correcting the coordinate values DXC and DYC based on an input of information DRD on data (difference) corresponding to the curving deviations of the moving mirrors MX and MY and stored in the coordinate correction unit 42, and another function of outputting instructions DSX and DSY to drive motors 30X and 30Y so as to move the stage ST to the target position. Needless to say, the stepper shown in FIG. 1 has other functions for various control operations, but such functions will not be described particularly because they do not directly relate to the present invention. Data DRD' on difference between values of data $D\theta_x$ and data $D\theta_y$ on curving deviations is sent from the coordinate correction unit 2 to the main control system 50 in a real time manner.

Next, a method of measuring curves of the reflecting surfaces of the moving mirrors MX and MY will be described below with respect to the moving mirror MY.

As mentioned above, in actual θ0 interferometers XθI and YθI, the rotational deviation of the moving mirrors MX and MY including yawing and curving deviations are measured on the basis of the fixed mirror (not shown). However, for simplification of explanation, it is assumed here that the inclination of the moving mirror MY (yawing and curving deviations) is detected with the θ interferometer YθI on the basis of a reference line RY imaginarily fixed, as shown in FIG. 5. Let the distance between the reference line RY and a point on the moving mirror be $Y_a$ (a value measured by the light wave interferometer YI) and the angle of a local curve of the moving mirror at the same point be $\theta Y(x)$. The difference $Y\theta(x)$ between $y\theta_1$ and $y\theta_2$ which represent the distances between the moving mirror MY and two points on the reference line RY spaced part from each other by SY in the direction x is measured with the θ interferometer YθI. That is, the counter circuit 40Y of the θ interferometer YθI shown in FIG. 1 outputs the difference $Y\theta(x)$ determined by the following equation:

$$Y\theta(x) = y\theta_2 - y\theta_1 \qquad (1)$$

The counter circuit 40Y is reset to zero when the measurement point on the moving mirror MY is at a direction x reference point $O_x$, that is, when the beam BY of the Y-axis light wave interferometer YI is incident upon the point $O_x$ fixed on the reflecting surface of the moving mirror MY. The light wave interferometer YI is also reset to zero when the measurement point is at the reference point $O_x$. The curve angle θ of the moving mirror is at most 1 to 2 seconds, and the distance SY is 10 to several 10 mm. The curve angle θ can therefore be approximated by the following equation:

$$\theta Y(x) = Y\theta(x)/SY \qquad (2)$$

On the other hand, the amount of unevenness $\Delta Y(x)$ of the reflecting surface of the moving mirror MY at a position x can be obtained with respect to the x reference point $O_x$ by the following formula:

$$\Delta Y(x) = \int_0^x \theta Y(x) dx \qquad (3)$$

This measurement is effected while the stage ST is moved in the direction x. During this operation, however, yawing of the stage ST takes place. It is therefore necessary to subtract an error determined by the extent of yawing from the measured value obtained by the equation (3). Accordingly, when the flatness of the Y-axis the moving mirror MY is measured, the extent of yawing $X\theta(x)$ of the stage ST with respect to the x reference point $O_x$ is simultaneously obtained by using the X-axis θ interferometer XθI. Since in this case the stage ST only moves in the direction x one-dimensionally, the two beams $BX\theta_1$ and $BX\theta_2$ of the θ interferometer XθI are continuously projected on the reflecting surface of the X-axis moving mirror MX at the same points. Since the counter circuit 40X of the θ interferometer XθI has been reset with respect to the reference point $O_x$, the value of the counter circuit 40X when the measurement point is at the position x is used as the extent of yawing Xq(x) of the stage ST based on the origin $O_x$.

Then, the stage ST is moved in the direction x, the value $X\theta(x)$ measured with the θ interferometer XθI is simultaneously read, and correction calculation is effected as expressed by the following equation to obtain the amount of true unevenness DY(x) of the moving mirror MY:

$$DY(x) = \int_0^x \theta Y(x) dx - \int_0^x X\theta(x) dx \qquad (4)$$

The amount of unevenness DY(x) is obtained at suitable positions of the stage ST in the direction x and the data on the measured amounts of unevenness is stored. Thereafter, the value measured by the Y-axis light wave interferometer YI is corrected with respect to the positions of the stage ST in the direction x, thus enabling position measurement in the direction y with substantially the same accuracy as a measurement influenced by no curving deviation or unevenness of the moving mirror MY.

The calculations of the equations (2) and (4) and the storage of the amount of true unevenness DY(x) are effected by the coordinate correction circuit 42, and the obtained values are used as constants by the position measuring apparatus.

With respect to the X-axis moving mirror MX, the amount of true unevenness DX(y) can be obtained and stored in the coordinate correction circuit 42 in the same manner while the stage ST is being moved in the direction y. In this case, if the measured value output from the counter circuit 40X of the $\theta$ interferometer X$\theta$I is X$\theta$(y) while the measured value output from the counter circuit 40Y of the $\theta$ interferometer Y$\theta$I is y$\theta$(y), the amount of unevenness DX(y) can be obtained by the following equations:

$$\theta X(y) = X\theta(y)/SX \qquad (5)$$

$$DX(y) = \int_0^y \theta X(y)dy - \int_0^y Y\theta(y)dy \qquad (6)$$

The above equations (4) and (6) are expressed as integration with respect to an interval of 0 to x and an interval of 0 to y, respectively. Actually, integration may be performed with respect to predetermined local intervals, e.g., every 5 to 10 mm. That is, if the length of each local interval is $\Delta L$, integration intervals in the direction X are defined as ranges of $(n-1)\cdot\Delta L$ to $n\cdot\Delta L$, n being successively shifted as $n=n+1$ where n is an integer equal to or greater than 1. Consequently, a table of data on the amounts of unevenness DY(x) and DX(y) corresponding to the respective ranges of $\Delta L$ of the measurement coordinate values of the light wave interferometers XI and YI is stored in the memory of the coordinate correction circuit 42.

If the above-described measurement of the amount of unevenness of each moving mirror is performed only for manufacture using the stepper or for maintenance, one of the two $\theta$ interferometers X$\theta$I and Y$\theta$I may be made detachable and may be attached only when it is used. However, in a case where the secular change is large or where it is necessary to remove even a very small error, it is preferable to always maintain both the two interferometers X$\theta$I and Y$\theta$I in the mounted state to frequently measure curves of the moving mirrors MX and MY.

The above-described embodiment relates to the application of the present invention to measurement of the position of the stepper stage and positioning of the same. However, the present invention can also be applied in the same manner to apparatus for measuring coordinate positions of patterns of masks and wafers with high accuracy.

The described embodiment is only intended to measure the position of the stage. This kind of apparatus including the stepper, however, requires alignment operation for determining the position of the wafer W in the apparatus coordinate system based on detecting the alignment marks on the wafer W. If, during this alignment operation, the stage ST rotates to a very small extent by yawing, the mark detection position is measured in a laterally shifted state. It is therefore necessary to correct this error by using the interferometer X$\theta$I or Y$\theta$I. A second embodiment of the present invention suitable for alignment operation will now be described below.

In a case where the marks are detected by the wafer alignment optical systems on the measurement axes of the light wave interferometers XI and YI, it is not necessary to correct the result of detection by a value corresponding to the error caused by yawing of the stage, as disclosed in U.S. Pat. No. 4,385,838. However, in the case of an arrangement, such as that shown in FIGS. 1 and 2, in which the detection centers of the wafer alignment optical systems WL and WR are not located on the production (measurement axes) of the beam BX of the X-axis light wave interferometers XI or the beam BY of the Y-axis light wave interferometers YI, it is necessary to correct the error caused by yawing of the stage during measurement of the mark positions on the wafer W.

Conventionally, it is not possible to separately deal with the inclination (rotation) of the stage ST owing to yawing and curves of the reflecting surfaces, if only one set of $\theta$ interferometers is provided as in the case of the example of the prior art.

According to the present invention, this problem can be avoided.

The second embodiment of the present invention will be described below with reference to FIG. 6.

Figure 6:
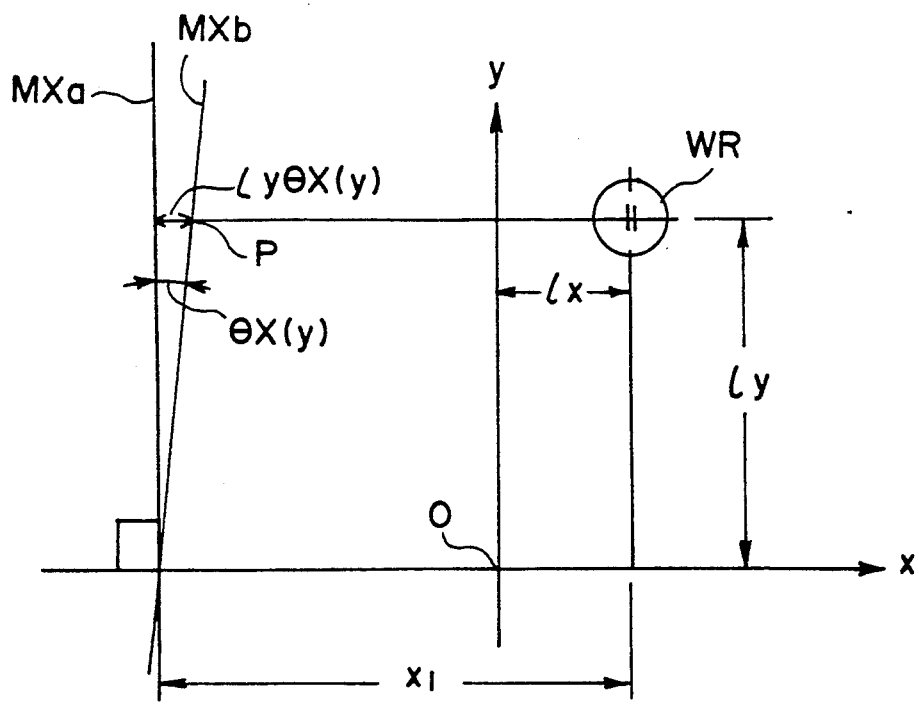
FIG. 6 is a diagram showing a state in which yawing occurs during positioning using alignment systems and in which the positioning is corrected with respect to the yawing.

FIG. 6 shows an error in the detection of a mark position on the wafer in the direction x effected by using the wafer alignment system WR disposed in a position at which an Abbe error takes place. In FIG. 6, the x-axis and the y-axis respectively correspond to the measurement axes (beams BX and BY) of the light wave interferometers XI and YI, and the origin correspond s to the position of the optical axis AX of the projecting lens PL. The detection center of the wafer alignment system WR is located at a distance $l_y$ from the x-axis in the direction y.

If the reflecting surface of the X-axis moving mirror MX is precisely perpendicular to the x-axis as indicated by MX$_a$ (parallel to the y-axis) when the mark on the wafer using the wafer alignment system WR, the stage ST is thereafter moved in the direction x by a certain extent $l_x$ and is also moved in the direction y by a certain extent $l_y$, thereby enabling the measured mark to coincide with the point O while avoiding any error. However, if the reflecting surface MX of the moving mirror MX has been rotated by $\theta X(y)$ from the axis y as indicated by MX$_b$ at the time of detection of the mark on the wafer, a point P on the reflecting surface MX$_b$ at a distance of $l_y$ from the x-axis is shifted by $l_y\cdot\theta X(y)$ in the direction x, as shown in FIG. 6. To make the mark on the wafer coincide with the origin O, it is necessary to correct the extent of translation of the stage ST in the direction x by $l_y\cdot\theta X(y)$ with respect to the design distance $l_x$.

The result of measurement of the extent of yawing $\theta X(y)$ of the stage ST contains an error owing to a curve of the reflecting surface of the moving mirror MX. However, the extent of true yawing can be obtained in the same manner as the first embodiment. That is, the amounts of true unevenness DX(y) and DY(x) of the moving mirrors MX and MY expressed by the equations (4) and (6) or on local inclinations $Y\theta(x)$ and $X\theta(y)$ expressed by the equations (1) and (5) are measured and information on these values are stored. The values measured by the $\theta$ interferometers $X\theta I$ and $Y\theta I$ are corrected by the stored values to remove the influence of the curve of the reflecting surface.

This yawing correction for the alignment operation is effected by the main control system 50 and the coordinate correction circuit 42. An actual correction sequence may be such that the position of the stage ST when a mark on the wafer is detected with the wafer alignment system WR (or WL) is measured with the light wave interferometers XI and YI, and the extent of yawing at the same position is simultaneously detected with one of or both the $\theta$ interferometers $X\theta I$ and $Y\theta I$. In the coordinate correction circuit or the main control system 50, the values measured by the $\theta$ interferometers $X\theta I$ and $Y\theta I$ are corrected by referring to a table of the amounts of unevenness $DX(y)$ and $DY(x)$ or local inclinations $Y\theta(x)$ and $X\theta(y)$ previously stored, thereby obtaining the extent of true yawing. In case where both the two $\theta$ interferometers $X\theta I$ and $Y\theta I$ are used, the amounts of true yawing obtained may be added and averaged to obtain one amount of true yawing.

If the amounts of true yawing obtained on the X-axis side and the Y-axis side greatly differ from each other, it is considered that a very small rotational deviation of at least one of the moving mirrors on the stage ST has occurred during the movement of the stage ST. In this event, it is preferable to stop the operation of the apparatus to execute a process of self checking or calibration. In some cases, it is necessary to rewrite the table stored in the coordinate correction circuit 42.

As described above, the present invention makes it possible to easily correct an error owing to yawing with high accuracy even in a case where the position of a mark on the wafer W is measured with an alignment system incapable of avoiding Abbe errors. As a result, high-accuracy wafer alignment can be achieved.

A positioning method and an apparatus based on this apparatus in accordance with a third embodiment of the present invention will be described below.

In a stepper, the visual field in which an projected image is formed has a two-dimensional size, and a rotation error (chip rotation) occurs in the visual field every exposure shot (stepping) owing to yawing of the stage ST. This chip rotation is considerable when first-layer patterns are printed on the wafer W or at the time of superposition printing of second-layer patterns and other subsequent patterns. In particular, if requirements relating to positioning errors and superposing errors become strict, chip rotation cannot be ignored.

Figure 7:
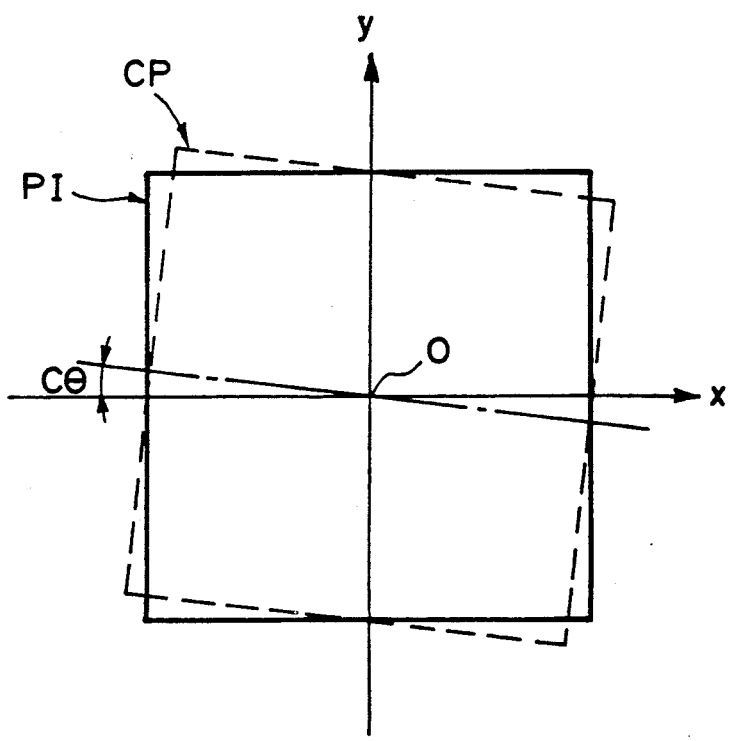
FIG. 7 is a plan view showing magnified chip rotation.

FIG. 7 shows magnified chip rotation. Assuming that a rectangular projected image PI of the reticle R is not rotated relative to the x-y coordinate system, a shot region CP on the wafer W is rotated relative to the image PI by yawing of the wafer stage ST. This relative rotation creates an amount of chip rotation $C\theta$. If the amount of chip rotation $C\theta$ is creases for one second, an alignment error of about 0.075 μm occurs at an end of the image PI having 15 × 15 mm size (or the shot region CP). To prevent this error, the actual yawing of the stage ST may be monitored and the holder retaining the wafer W may be rotated to a very small extent in the direction opposite to the yawing direction in accordance with a value determined by monitoring to constantly maintain the direction of arrangement of shots on the wafer W in the absolute coordinate system.

Figure 8:
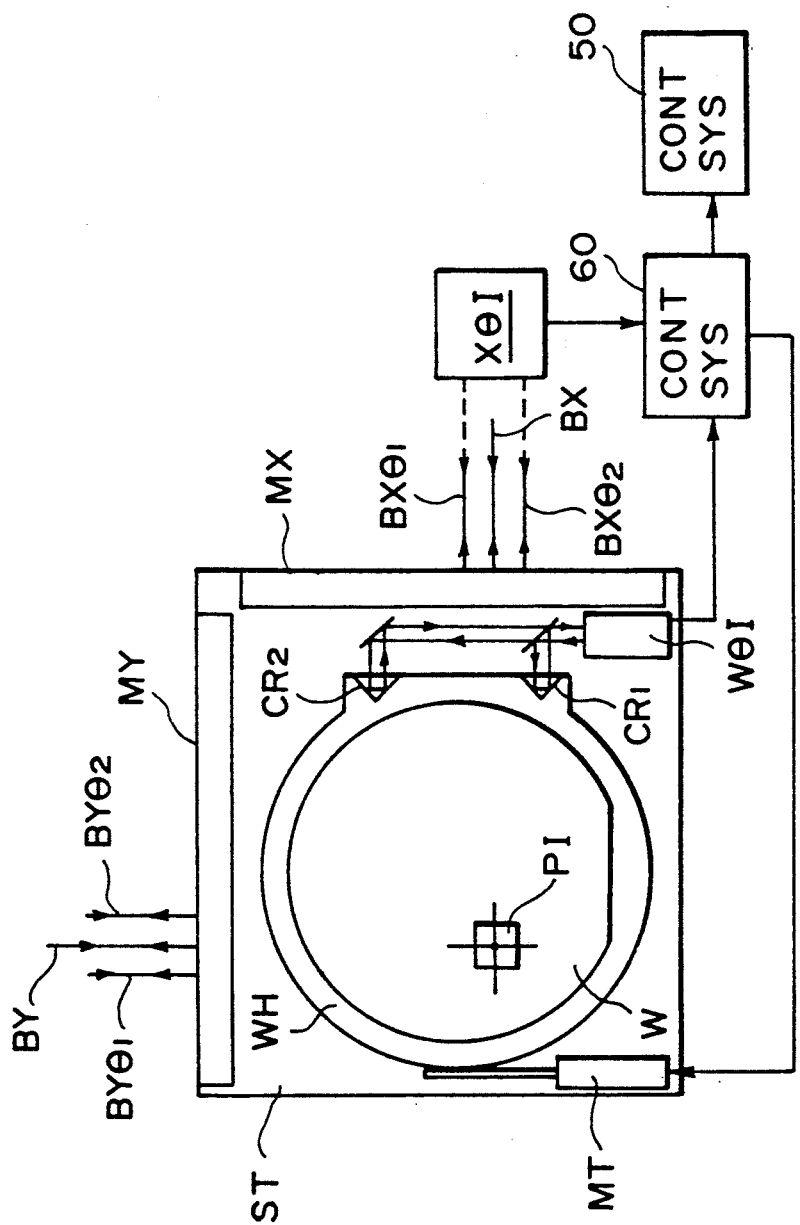
FIG. 8 is a schematic plan view of wafer stage construction suitable for prevention of chip rotation (yawing).

To perform this operation, a wafer holder WH capable of $\theta$ rotation is provided on the stage S, as shown in FIG. 8. The wafer holder WH is rotated to a very small extent by a motor MT and a control system 60. Two corner reflectors (right angle mirrors) $CR_1$ and $CR_2$ are fixed to portions of the wafer holder WH. Beams are projected from a $\theta$ interferometer $W\theta I$ mounted on the stage ST to the respective reflectors $CR_1$ and $CR_2$. It is thereby possible to precisely measure the extent of rotation of the holder WH on the stage. In this arrangement, the control system 60 is supplied with the extent of true yawing corrected in the same manner as the first embodiment form the $\theta$ interferometer $X\theta I$, the coordinate correction circuit 42 or the like, and servo-controls the motor MT while monitoring the value measured by the $\theta$ interferometer $W\theta I$ so that the wafer holder WH rotates in the opposite direction by an angle corresponding to the extent of yawing (the extent of rotation of the stage ST based on the position at the origin). This operation is successively conducted after wafer alignment (global alignment, EGA or the like) has been completed. The servo control using the motor MT is continued during step-and-repeat exposure.

The center of rotation of the wafer holder WH is not located at the center of each shot region on the wafer W, the rotation of the wafer holder WH therefore causes each shot region to be shifted to a very small extent in each of the directions x and y from the position determined by the alignment operation. To cope with this, the control system 60 calculates the shifts of the shot position in the directions X and Y according to the extent of rotation of the wafer holder WH, and outputs information for correspondingly correcting the stepping position of the stage ST to the control system 50 shown in FIG. 1.

Alternatively, the arrangement may be such that after the correction of rotation of the wafer holder WH has been effected only one time at the time of global alignment, step-and-repeat exposure is effected while measuring the extent of true yawing of the stage ST and while correcting the rotational position of the reticle stage (not shown) retaining the reticle in the same direction as the yawing direction. In this case, the center of each shot region on the wafer W may be made to coincide with the center of the projected image PI, and there is no need for very small shifts in the directions X and Y such as those in the case of the rotation of the members on the side of the wafer W for yawing correction. Also, in this case, it is preferable to minimize the misalignment of the center of rotation of the reticle stage with the center of the reticle R and to provide a $\theta$ interferometer or the like for monitoring the rotational deviation.

Further, the arrangement may be such that the error in the relative rotation between each shot region on the wafer W and the reticle R is detected with an alignment system of a TTR (through-the-reticle) or TTL (through-the-lens) type and a sequence of operations for rotating the reticle stage or the wafer stage ST to a very small extent is conducted in combination with this alignment system to correct this error.

In accordance with the present invention, as described above, only the amount of true yawing is detected while removing the influence of curves of the reflecting surfaces of the moving mirrors MX and MY to rotate the wafer W or the reticle R to a very small extent, thereby making it possible to effect correction with respect to chip rotation starting from shots of first-layer patterns printed on the wafer W by first printing and to limit the occurrence of chip rotation owing to the influence of yawing at the time of superposing exposure for second and other subsequent layers.

In each of the described embodiments of the present invention, the rotational deviation (curving deviation) of each of the moving mirrors MX and MY is measured with an $\theta$ interferometer using a coherent beam. However, it is not always necessary to use the interferometer. For example, an auto-collimator system may be utilized to project a bundle of parallel rays on the projecting surface of each moving mirror, and the change in the bundle of reflected rays in the reflecting direction may be detected photoelectrically, thereby enabling the same effects. Preferably, in this arrangement, the bundle of parallel rays projected on the moving mirror has a rectangular cross-sectional shape having a length of 10 to several ten mm in the direction in which the reflecting surface extends.

The exposure system may be on any type, including a proximity type based on placing the mask and the wafer close to each other and an aligner or step-and-scan type based on integrally scanning the mask and the wafer with respect to the projecting optical system.

Each of the X-axis and Y-axis moving mirrors MX and MY may be formed by polishing two side surfaces perpendicular to each other and depositing aluminum or the like on the polished surface.

As described above, the present invention makes it possible to measure and record curves of the plane mirrors without being substantially influenced by yawing and, hence, to correct the curving deviations at the time of measurement of X- and Y-coordinates, thereby high-accuracy two-dimensional coordinate measurement. The use of the coordinate measuring unit of the present invention enables an improvement in the accuracy of two-dimensional coordinate measurement. If it is utilized for a pattern transfer apparatus such as a stepper, the positioning accuracy can be improved. Even in a case where there is a relative angular change between the two plane mirrors facing the directions X and Y as well as curves of the plane mirrors, this relative change can be monitored to maintain the desired accuracy of coordinate measurement. If the present invention is applied to yawing correction for position measurement using an observation system which causes an Abbe error, the yawing can be corrected with accuracy and the error owing to the yawing can also be corrected with accuracy.

If the present invention is applied to correction of chip rotation in a stepper or the like, the extent of true yawing can be corrected and the chip rotation can therefore be corrected with accuracy, thereby improving the superposing accuracy.

What is claimed is:

1. A method of measuring a position of a stage moved in a predetermined direction, the stage having a first plane mirror extending in said predetermined direction and a second plane mirror extending in a direction perpendicular to the predetermined direction, comprising the steps of:
   (a) measuring a change in the distances to a reflecting surface of said first plane mirror in a direction perpendicular to the reflecting surface by a light wave interferometer;
   (b) substantially simultaneously measuring local curving deviations of reflecting surface of said first and second plane mirrors, respectively, and
   (c) correcting the position of the stage measured with the light wave interferometer on the basis of the measured values of said curving deviations.

2. An apparatus for measuring a position of a stage moved in a predetermined direction, the stage having a first plane mirror extending in said predetermined direction and a second plane mirror extending in a direction perpendicular to the predetermined direction, comprising:
   a light wave interferometer for measuring a change in the distance to a reflecting surface of said first plane mirror in a direction perpendicular to the reflecting surface;
   first and second measuring means for measuring local curving deviations of the reflecting surfaces of said first and second plane mirrors with respect to the directions in which the reflecting surfaces extend, respectively;
   storage means substantially simultaneously supplied with measured values obtained from said first and second measuring means when the stage is moved in said predetermined direction, said storage means obtaining and storing data according to the difference between the measured values in correspondence with the position of said stage; and
   means for determining a position of the stage measured with said light wave interferometer on the basis of the change in the distance and the data stored in said storage means.

3. A method of measuring a position of a mark on a stage moved in a predetermined direction, the stage having a first plane mirror extending in said predetermined direction and a second plane mirror extending in a direction perpendicular to the predetermined direction, comprising the steps of:
   (a) measuring a change in the distances to a reflecting surface of said first plane mirror in a direction perpendicular to the reflecting surface by a light wave interferometer, while detecting said mark by mark detecting means deviated from the measurement axis of the light wave interferometer;
   (b) measuring local rotational deviations of reflecting surfaces of said first and second plane mirrors with respect to the directions in which the reflecting surfaces extend, respectively;
   (c) obtaining the curving deviations of the reflecting surface of said first plane mirror on the basis of different between measured values obtained in step (b), and obtaining the extent of yawing of the stage with respect to said predetermined direction on the basis of at least one of the rotational deviations measured in step (b) corrected according to the curving deviations; and
   (d) correcting a position of the mark measured by the mark detecting means on the basis of the extent of yawing.

4. An apparatus for measuring a position of a mark on a stage moved in a predetermined direction, the stage having a first plane mirror extending in said predetermined direction and a second plane mirror extending in a direction perpendicular to the predetermined direction, comprising:
   a light wave interferometer for measuring a change in the distance to a reflecting surface of said first plane mirror in a direction perpendicular to the reflecting surface;

mark detecting means for detecting said mark on the stage at a position deviated from a measurement axis of said light wave interferometer;

first and second rotational deviation measuring means for measuring local rotational deviations of the reflecting surfaces of said first and second plane mirrors with respect to the directions in which the reflecting surfaces extend, respectively;

means for obtaining the curving deviations of the reflecting surface of said first plane mirror on the basis of the difference between the measured values obtained by said first and second rotational deviation measuring means, and for obtaining the extent of true yawing of the stage with respect to said predetermined direction by correcting the rotational deviations measured by at least one of said first and second rotational deviation measuring means according to the curving deviations; and correction means for correcting a position of the mark measured by the mark detecting means on the basis of the extent of yawing.

5. A method in which a pattern is projected on a substrate retained on a stage provided with a first plane mirror having a reflecting surface extending in a predetermined direction and a second plane mirror having a reflecting surface extending in a direction perpendicular to said predetermined direction, and in which the stage is moved in said predetermined direction and is positioned so that a predetermined positional relationship is established between the projected pattern and the substrate, said method comprising the steps of:

(a) measuring a change in the distances to the reflecting surface of said first plane mirror in a direction perpendicular to the reflecting surface by a light wave interferometer while detecting a beam on said first plane mirror;

(b) separately measuring local rotational deviations of the reflecting surfaces of said first and second plane mirrors, respectively;

(c) determining the extent of true yawing of the stage with respect to said predetermined direction on the basis of the measured values separately obtained in step (b) while removing the influence of curving deviations of the reflecting surfaces of said first plane mirror; and (d) correcting a rotational error due to the yawing by relatively rotating the projected pattern and the substrate according to the extent of true yawing.

6. An apparatus in which a pattern is projected on a substrate retained on a stage moved in a predetermined direction and the stage is positioned so that a predetermined region on the substrate coincides with the projected pattern, comprising:

first and second plane mirrors provided on the stage and having reflecting surfaces respectively extending in said predetermined direction and a direction perpendicular to said predetermined direction;

a light wave interferometer for measuring a change in the distances to said first plane mirror;

a pair of rotational deviation measuring means for separately measuring local rotational deviations of the reflecting surfaces of said first and second plane mirrors with respect to the directions in which the reflecting surfaces extend;

means for obtaining the curving deviations of the reflecting surfaces of said first and second plane mirrors on the basis of the difference between the measured values obtained by said pair of rotational deviation measuring means;

means for obtaining the extent of true yawing of the stage by correcting the rotational deviations measured by at least one of said pair of rotational deviation measuring means according to the curving deviations; and rotational correction means for relatively rotating the substrate and the projected pattern on the basis of the extent of true yawing when the stage is positioned so that the predetermined region on the substrate and the projected pattern coincide.

* * * * *